United States Patent
Guo et al.

(10) Patent No.: US 12,160,990 B2
(45) Date of Patent: Dec. 3, 2024

(54) SEMICONDUCTOR STRUCTURE AND METHOD OF FABRICATING THE SAME

(71) Applicant: MACRONIX INTERNATIONAL CO., LTD., Hsinchu (TW)

(72) Inventors: Jung-Yi Guo, Hsinchu County (TW); Chun-Min Cheng, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 428 days.

(21) Appl. No.: 17/678,287

(22) Filed: Feb. 23, 2022

(65) Prior Publication Data

US 2023/0269938 A1 Aug. 24, 2023

(51) Int. Cl.
*H10B 43/20* (2023.01)
*H10B 41/10* (2023.01)
*H10B 41/20* (2023.01)
*H10B 43/10* (2023.01)

(52) U.S. Cl.
CPC .......... *H10B 43/20* (2023.02); *H10B 41/10* (2023.02); *H10B 41/20* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 11,233,062 B2 | 1/2022 | Kim et al. | |
| 11,430,808 B2 | 8/2022 | Song et al. | |
| 2013/0009236 A1 | 1/2013 | Lee et al. | |
| 2017/0338243 A1* | 11/2017 | Sohn | H10B 43/27 |
| 2021/0305270 A1 | 9/2021 | Jeong et al. | |
| 2021/0375937 A1* | 12/2021 | Wu | H10B 51/10 |
| 2023/0157016 A1* | 5/2023 | Liao | H10B 41/40 |
| | | | 257/314 |
| 2023/0260912 A1* | 8/2023 | Liao | H01L 23/535 |
| | | | 257/324 |

FOREIGN PATENT DOCUMENTS

| | | | | |
|---|---|---|---|---|
| CN | 112185967 A | | 1/2021 | |
| CN | 112310096 A | | 2/2021 | |
| CN | 112652628 A | | 4/2021 | |
| CN | 111048520 B | * | 9/2023 | ....... H01L 21/28531 |
| TW | 202139469 A | | 10/2021 | |
| TW | 202145513 A | * | 12/2021 | ........ H01L 27/11553 |

* cited by examiner

*Primary Examiner* — Michael Lebentritt
(74) *Attorney, Agent, or Firm* — McClure, Qualey & Rodack, LLP

(57) ABSTRACT

A semiconductor structure includes a substrate, a common source plane disposed on the substrate, a plurality of memory cells vertically disposed on the substrate and electrically connected to the common source plane, a common source line disposed on the substrate and electrically connected to the common source plane, and an isolation pillar. The common source line extends along a first direction and has a first segment and a second segment. The isolation pillar interposes the first segment and the second segment of the common source line.

20 Claims, 20 Drawing Sheets

S28

SEMICONDUCTOR STRUCTURE AND METHOD OF FABRICATING THE SAME

BACKGROUND

Field of Invention

The present invention relates to a semiconductor structure and a method of fabricating the same.

Description of Related Art

In recent years, the structures of semiconductor devices have been changed constantly, and the storage capacity of the devices has been increased continuously. Memory devices are used in storage elements for many products such as digital cameras, mobile phones, computers, etc. As the application increases, the demand for the memory device focuses on small size and large memory capacity. For satisfying the requirement, a memory device having a high element density and a small size and the manufacturing method thereof are in need.

As such, it is desirable to develop a three-dimensional (3D) memory device with larger number of multiple stacked planes to achieve greater storage capacity, improved qualities, all the while remaining in a small size.

SUMMARY

According to an aspect of the disclosure, a semiconductor structure includes a substrate, a common source plane disposed on the substrate, a plurality of memory cells vertically disposed on the substrate and electrically connected to the common source plane, a common source line disposed on the substrate and electrically connected to the common source plane, and an isolation pillar. The common source line extends along a first direction and has a first segment and a second segment. The isolation pillar interposes the first segment and the second segment of the common source line.

According to some embodiments, ends of the first segment and the second segment of the common source line are embedded in the isolation pillar.

According to some embodiments, the isolation pillar includes a first portion directly between the first segment and the second segment of the common source line and a pair of second portions sandwiching the first portion and ends of the first segment and the segment of the common source line.

According to some embodiments, the isolation pillar includes a first portion directly between the first segment and the second segment of the common source line and a pair of second portions sandwiching the first portion. A length of the first portion in the first direction is smaller than a length of the second portions in the first direction.

According to some embodiments, the isolation pillar includes a first portion directly between the first segment and the second segment of the common source line and a pair of second portions sandwiching the first portion. A length of the second portions in the first direction is 1 to 5 times of a length of each of the memory cells in the first direction.

According to some embodiments, a width of the isolation pillar in a second direction is greater than a width of the common source line in the second direction, in which the second direction is perpendicular to the first direction.

According to some embodiments, a bottom of the isolation pillar has a bottom length, a top of the isolation pillar has a top length, and the bottom length is greater than the top length, in the first direction.

According to some embodiments, the semiconductor structure further includes an isolation spacer between the common source line and the isolation pillar.

According to some embodiments, a bottom of the isolation spacer is below a bottom of the isolation pillar.

According to some embodiments, a material of the isolation pillar comprises silicon oxide or carbon-doped silicon.

According to some embodiments, the semiconductor structure further includes a metal plug disposed on the common source line, in which a top surface of the metal plug is level with a top surface of the isolation pillar.

According to some embodiments, the semiconductor structure further includes a buffer layer disposed between the common source plane and the substrate.

Another aspect of the disclosure provides method of fabricating a semiconductor structure, the method includes forming a common source plane on a substrate; forming a plurality of insulating layers and a plurality of sacrificial layers alternately stacked on the common source plane; forming a plurality of memory cells penetrating the insulating layers and the sacrificial layers and electrically connecting to the common source plane; forming an isolation pillar penetrating the insulating layers and the sacrificial layers; forming a slit penetrating the insulating layers and the sacrificial layers, in which the slit is formed cut into the isolation pillar; and filling the slit with a common source line.

According to some embodiments, a portion of the isolation pillar is removed during forming the slit.

According to some embodiments, the slit is formed deeper than the isolation pillar.

According to some embodiments, the method further includes, before filling the slit with the common source line, forming an isolation spacer on a sidewall of the slit.

According to some embodiments, the method further includes forming a metal plug on the common source line.

According to some embodiments, the method further includes replacing the sacrificial layers with a plurality of gate structures.

According to some embodiments, a material of the sacrificial layers is different from a material of the isolation pillar.

According to some embodiments, a diameter of the isolation pillar is 1 to 5 times of a diameter of each of the memory cells.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
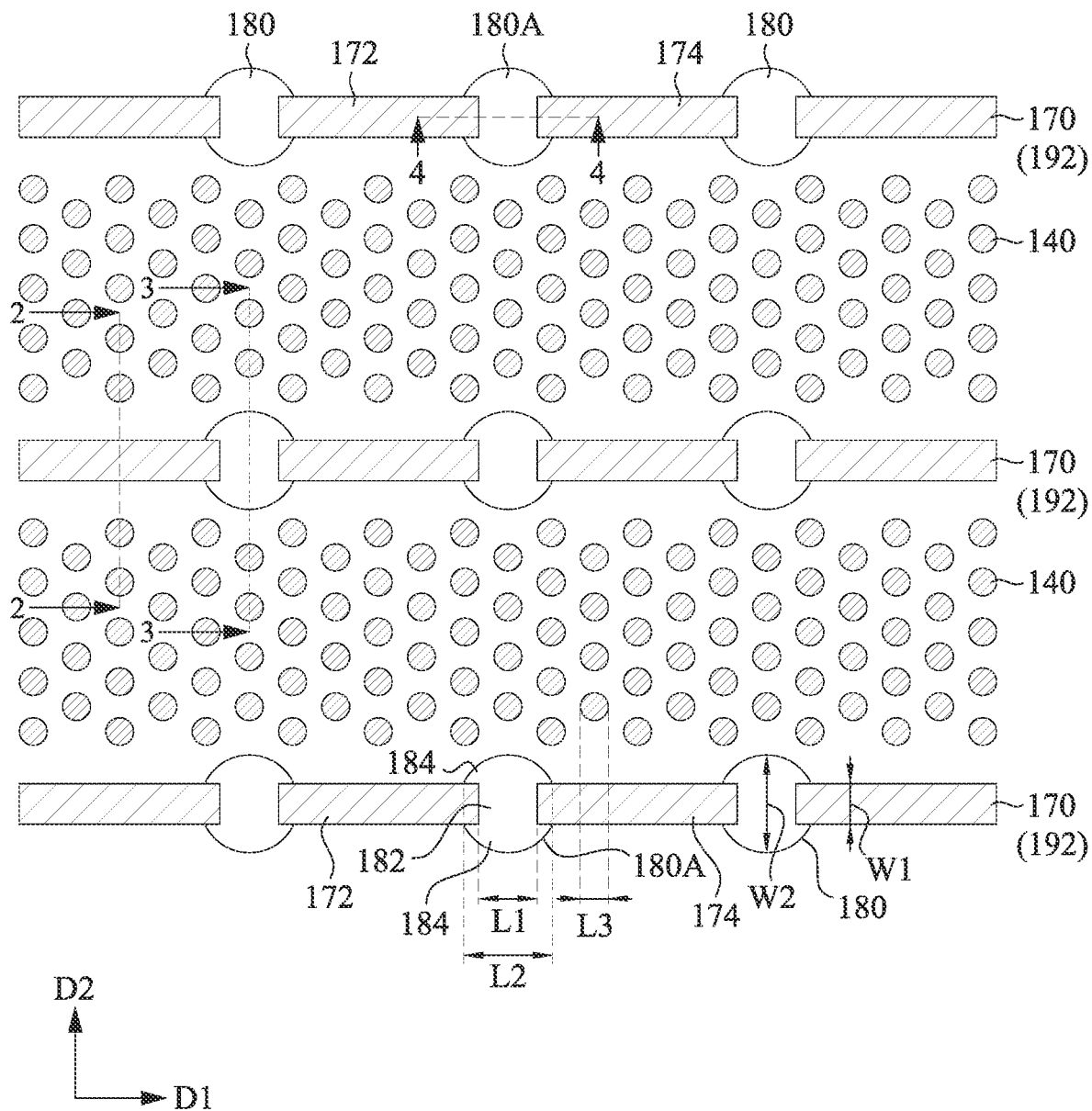
FIG. 1 is a top view of a semiconductor structure according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
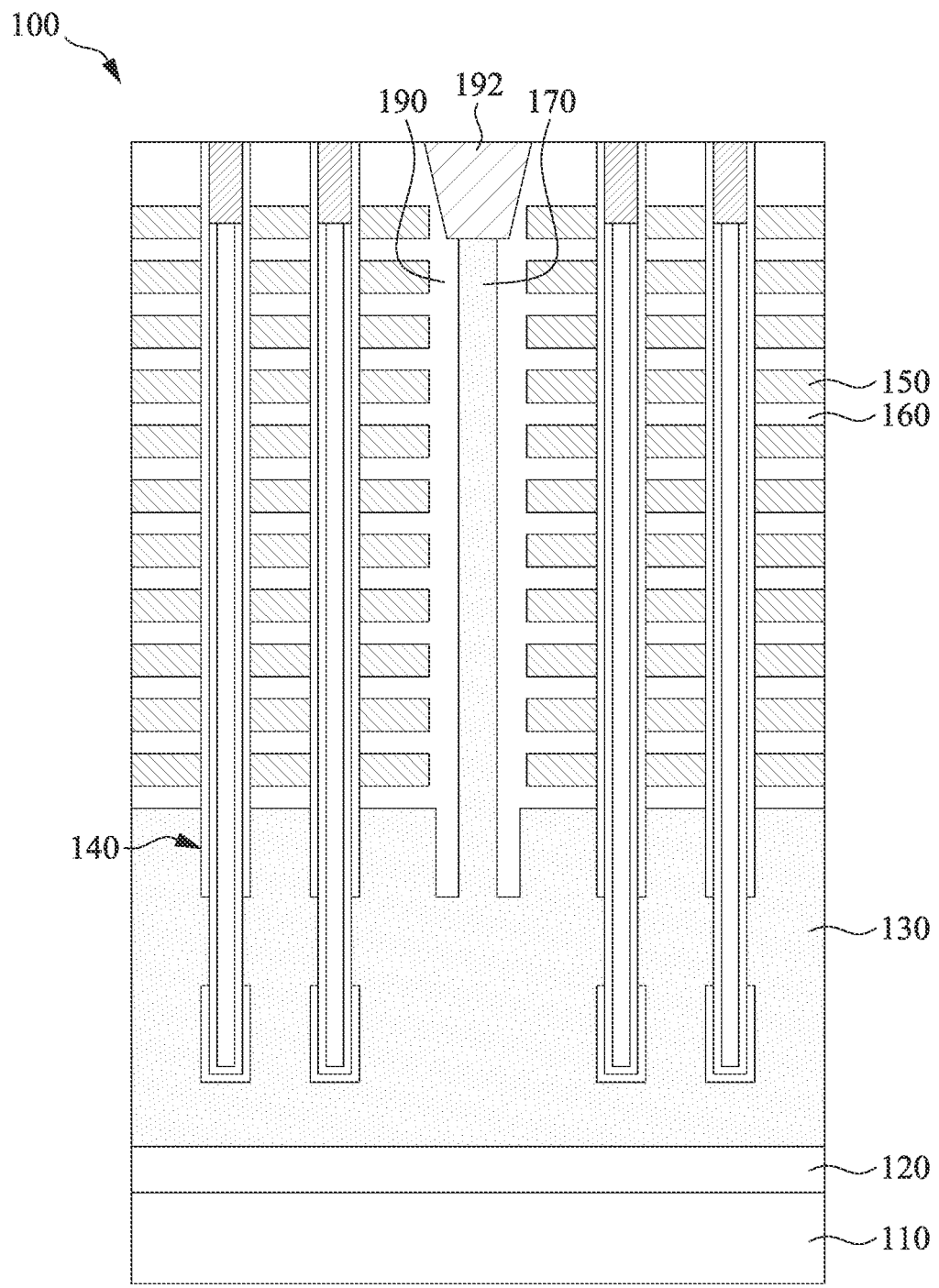
FIG. 2 is a cross-sectional view of the semiconductor structure taken along line 2-2 of FIG. 1 according to some embodiments of the disclosure.
Figure 3:
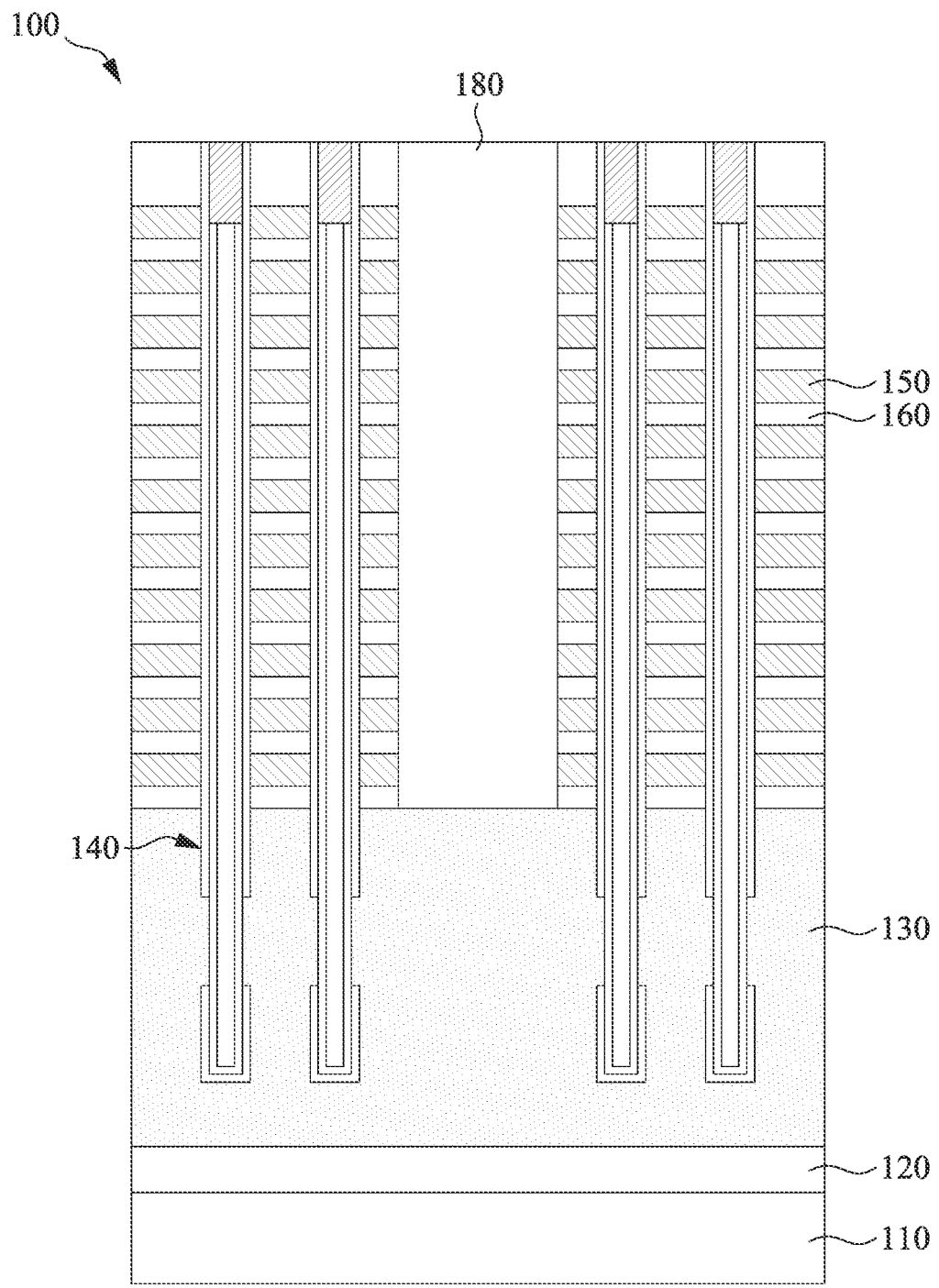
FIG. 3 is a cross-sectional view of the semiconductor structure taken along line 3-3 of FIG. 1 according to some embodiments of the disclosure.
Figure 4:
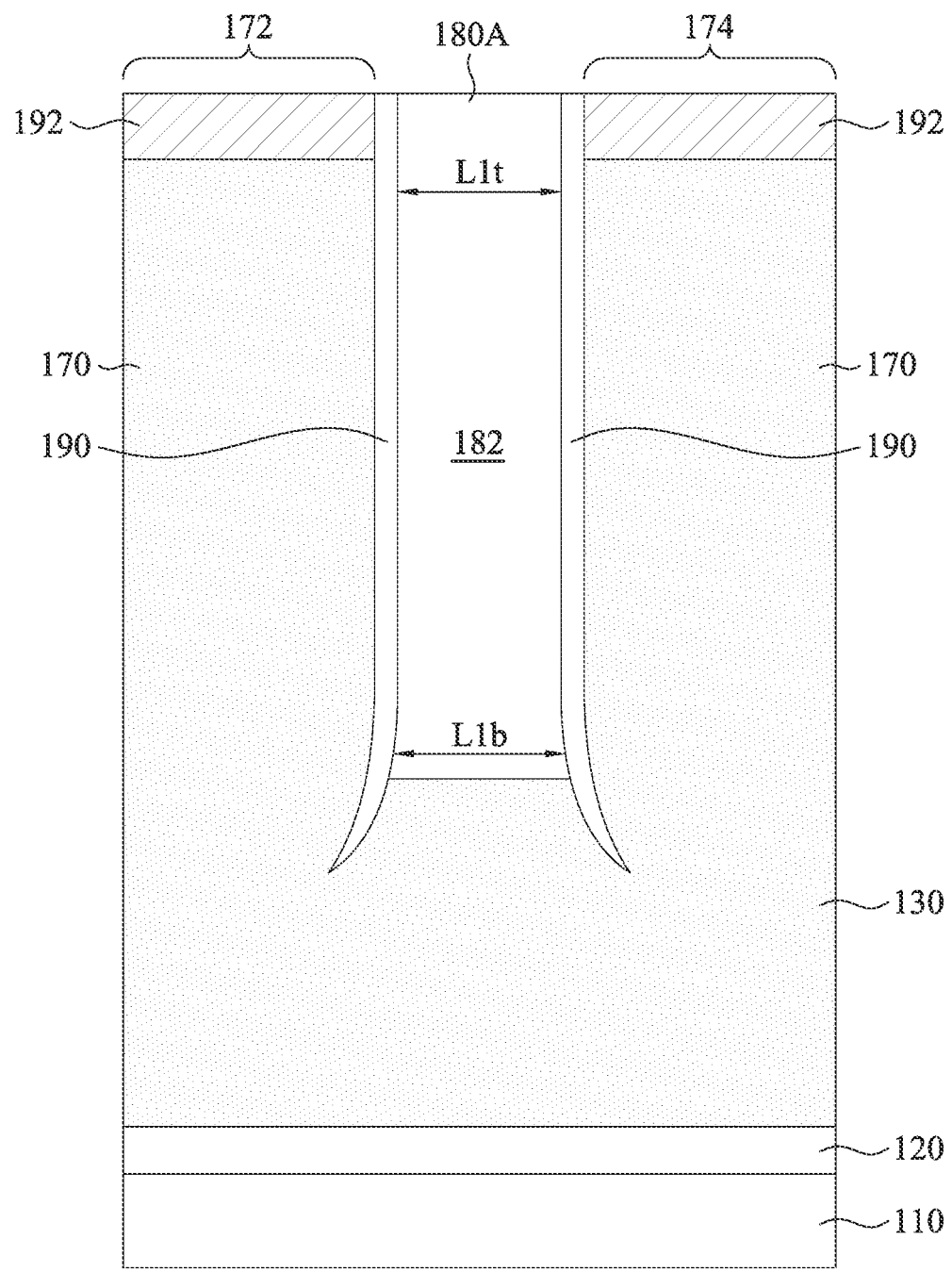
FIG. 4 is a cross-sectional view of the semiconductor structure taken along line 4-4 of FIG. 1 according to some embodiments of the disclosure.

Reference is made to FIG. 1, FIG. 2, FIG. 3, and FIG. 4, in which FIG. 1 is a top view of a semiconductor structure according to some embodiments of the disclosure, FIG. 2 is a cross-sectional view of the semiconductor structure taken along line 2-2 of FIG. 1 according to some embodiments of the disclosure, FIG. 3 is a cross-sectional view of the semiconductor structure taken along line 3-3 of FIG. 1 according to some embodiments of the disclosure, and FIG. 4 is a cross-sectional view of the semiconductor structure taken along line 4-4 of FIG. 1 according to some embodiments of the disclosure.

The semiconductor structure 100 includes a substrate 110, a buffer layer 120 on the substrate 110, a common source plane 130 on the buffer layer 120, a plurality of memory cells 140 vertically disposed on the substrate 110 and electrically connected to the common source plane 130. The semiconductor structure 100 further includes a plurality of gate structures 150 disposed surrounding the memory cells 140 and a plurality of insulating layers 160 disposed surrounding the memory cells 140 and between the gate structures 150.

The semiconductor structure 100 includes a plurality of common source lines 170 disposed on the substrate 110. The common source lines 170 are electrically connected to the common source plane 130. The common source lines 170 extend along a first direction D1, and the common source lines 170 are substantially parallel to each other. The semiconductor structure 100 further includes a plurality of isolation pillars 180. The isolation pillars 180 interpose the common source lines 170 such that each of the common source lines 170 is cut into a plurality of segments, and the adjacent two of the segments in the first direction D1 are separated by one of the isolation pillars 180.

Comparing to the situation without the isolation pillars 180 and having long and continuous common source lines, the present disclosure interposes the isolation pillars into the common source lines 170 to reduce the length of each segment of the common source lines 170. Thus the wiggling or bending issue of the common source lines 170, induced by etching, thermal annealing, or other processes, can be improved.

In some embodiments, the common source lines 170 are surrounded by the isolation spacers 190, and the metal plugs 192 are disposed on the top surface of the common source lines 170. In some embodiments, the top surface of the metal plugs 192 is level with the top surface of the isolation pillars 180.

More particularly, in some embodiments, the segments of the common source lines 170, such as a first segment 172 and a second segment 174, are separated by one of the isolation pillars 180, such as an isolation pillar 180A.

The first segment 172 and the second segment 174 are end-to-end arranged and align to each other along the first direction D1. The opposite ends of the first segment 172 and the second segment 174 are embedded in the isolation pillar 180A.

The isolation pillar 180A not only fills the space between the first segment 172 and the second segment 174, but also wraps the ends of the first segment 172 and the second segment 174. More particularly, in some embodiments, each of the isolation pillars 180 has a first portion 182 directly between the ends of the first segment 172 and the second segment 174 and a pair of second portions 184 sandwiching the first portion 182. In some embodiments, the ends of the first segment 172 and the second segment 174 are also sandwiched by the second portions 184 of the isolation pillar 180A.

In some embodiments, the length L1 of the first portion 182 of the isolation pillar 180 in the first direction D1 is smaller than the maximum length L2 of the second portions 184 of the isolation pillar 180 in the first direction D1. The length L1 of the first portion 182 of the isolation pillar 180 in the first direction D1 is approximately the distance between the ends of the first segment 172 and the second segment 174. In some embodiments, the maximum length L2 of the second portions 184 of the isolation pillar 180 is about 1 to 5 times of the length L3 of the memory cell 140 in the first direction D1. In some embodiments, the second portions 184 of the isolation pillar 180 has the longest maximum length L2 adjacent the interface between the first portion 182 and the second portions 184. The length L2 of the second portions 184 of the isolation pillar 180 in the first direction D1 decreases away from the first portion 182. Each of the common source lines 170 has a width W1 in a second direction D2, in which the second direction D2 is substantially perpendicular to the first direction D1. Each of the isolation pillars 180 has a width W2 in the second direction D2. The width W2 of the isolation pillars 180 is greater than the width W1 of the common source lines 170.

Reference is made to FIG. 4. The isolation pillar 180A stands on a top surface of the common source plane 130. The first portion 182 of the isolation pillar 180A is directly between the first segment 172 and the second segment 174. In some embodiments, the bottom of the isolation pillar 180A has the bottom length Lib, the top of the isolation pillar 180A has the top length Lit, and the bottom length L1*b* is greater than the top length L1*t*. In some embodiments, the isolation spacers 190 are deeper than the isolation pillar 180A, such that a bottom of the isolation spacers 190 is below a bottom of the isolation pillar 180A.

Figure 5A:
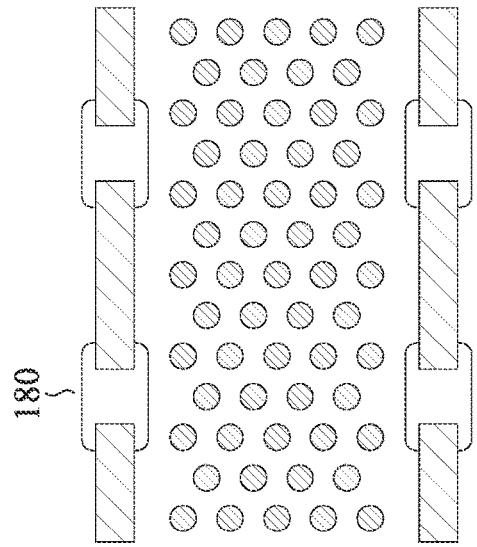
FIG. 5A to FIG. 5D are top views of the semiconductor structure according to different embodiments of the disclosure.
Figure 5B:
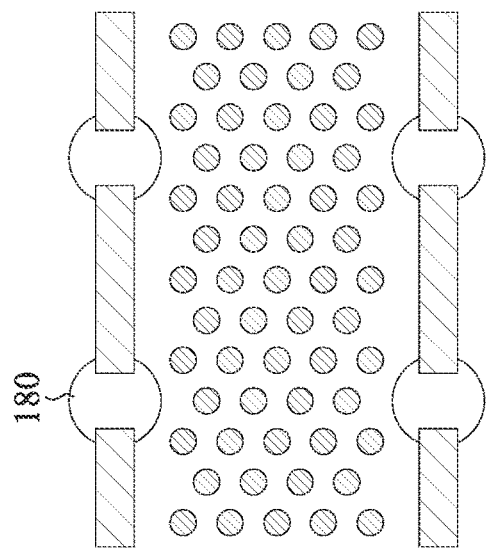
Figure 5C:
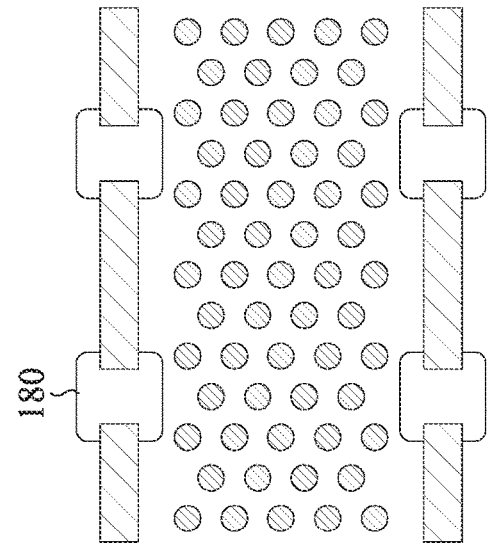
Figure 5D:
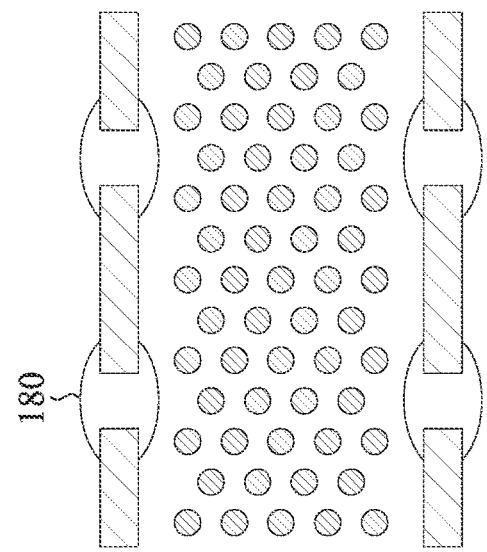

Reference is further made to FIG. 5A to FIG. 5D, in which FIG. 5A to FIG. 5D are top views of the semiconductor structure according to different embodiments of the disclosure. The shape of the isolation pillars 180 may have many variations. For example, the shape of the isolation pillars 180 can be a circle (as shown in FIG. 5A), a rectangle (as shown in FIG. 5B), an ellipse (as shown in FIG. 5C), or a square (as shown in FIG. 5D).

Reference is further made to FIG. 6 to FIG. 20, which are schematic views of sequential steps of a method of forming a semiconductor device, according to some embodiments of the disclosure, in which FIGS. 8, 11, 13, 14, 15, 16, 17, and 19 are cross-sectional views taken along line 2-2 of FIG. 1, FIGS. 6, 7, 9, and 18 are cross-sectional views taken along line 3-3 of FIG. 1, and FIGS. 10, 12, and 20 top views.

Figure 6:
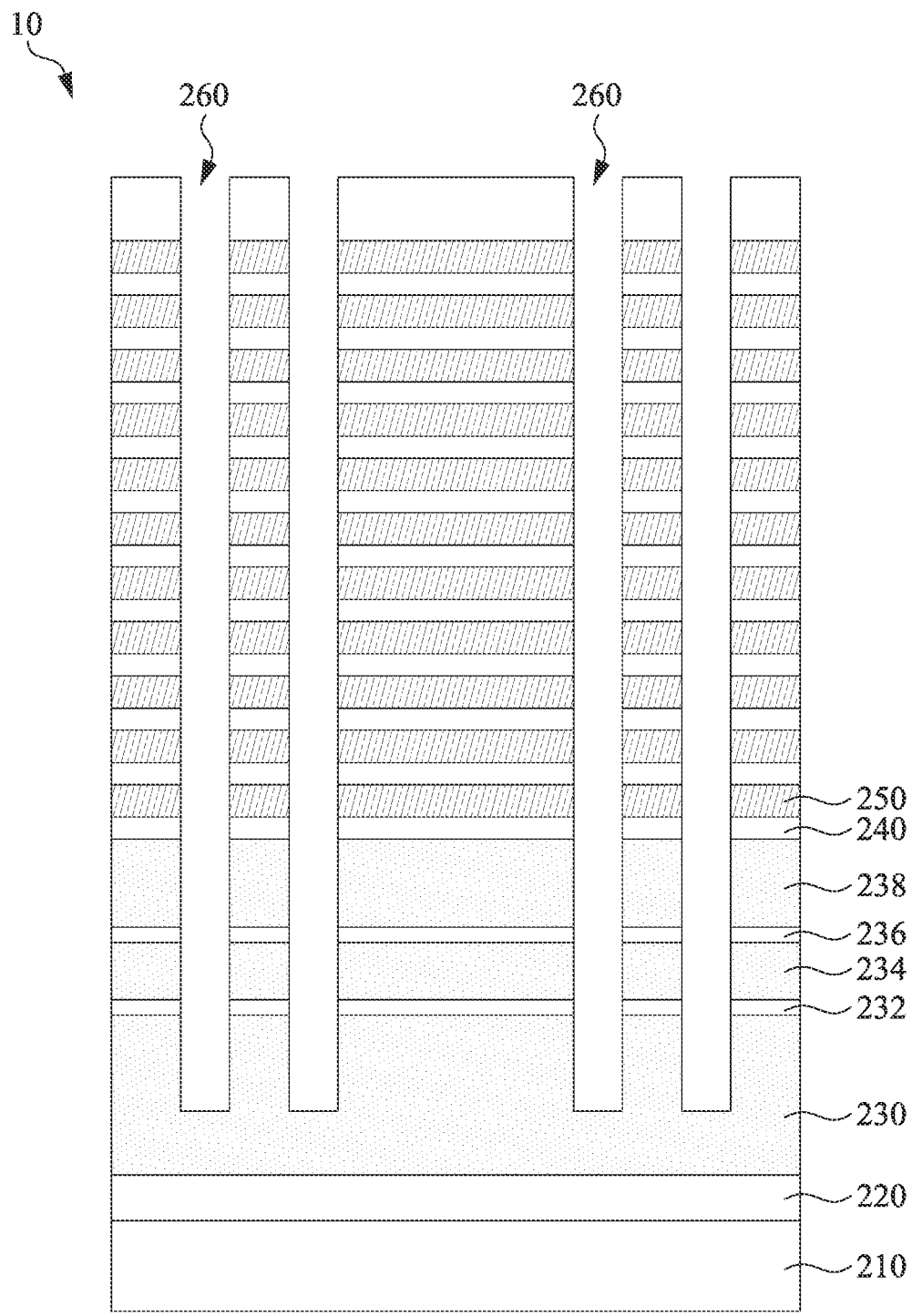
FIG. 6 to FIG. 20 are schematic views of sequential steps of a method of forming a semiconductor device, according to some embodiments of the disclosure.

Referring to FIG. 6, in step S10, a structure 10 is formed, including providing a substrate 210, forming a buffer layer 220 on the substrate 210, forming a first poly silicon layer 230 on the buffer layer 220, forming a first oxide layer 232 on the first poly silicon layer 230, forming a second poly silicon layer 234 on the first oxide layer 232, forming a second oxide layer 236 on the second poly silicon layer 234, and forming a third poly silicon layer 238 on the second oxide layer 236. The substrate 210 can be a silicon substrate or a silicon substrate including a plurality of semiconductor components, such as a plurality of complementary metal-oxide-semiconductor (CMOS) components and other suitable circuits. The material of the buffer layer 220 can be oxide, such as $SiO_2$. The first poly silicon layer 230, the second poly silicon layer 234, and the third poly silicon layer 238 can be doped with N-type dopants such as, for example, phosphorus (P) and arsenic (As) or doped with P-type dopants such as, for example, boron (B) and gallium (Ga).

Step S10 further includes forming a plurality of insulating layers 240 and a plurality of sacrificial layers 250 alternately on the third poly silicon layer 238, in which a bottommost insulating layer 240 is directly on the third poly silicon layer 238. The material of the insulating layers 240 is different from a material of the sacrificial layers 250. In some embodiments, the insulating layers 240 are oxide layers such as silicon oxide layers, and the sacrificial layers 250 are nitride layers such as silicon nitride layers.

Step S10 further includes performing an etching process to form a plurality of holes 260 penetrating the stack of the insulating layers 240 and the sacrificial layers 250, the third poly silicon layer 238, the second oxide layer 236, the second poly silicon layer 234, and the first oxide layer 232. In some embodiments, the etching process stops at the first poly silicon layer 230, and the buffer layer 220 is still covered by the remaining first poly silicon layer 230.

Figure 7:
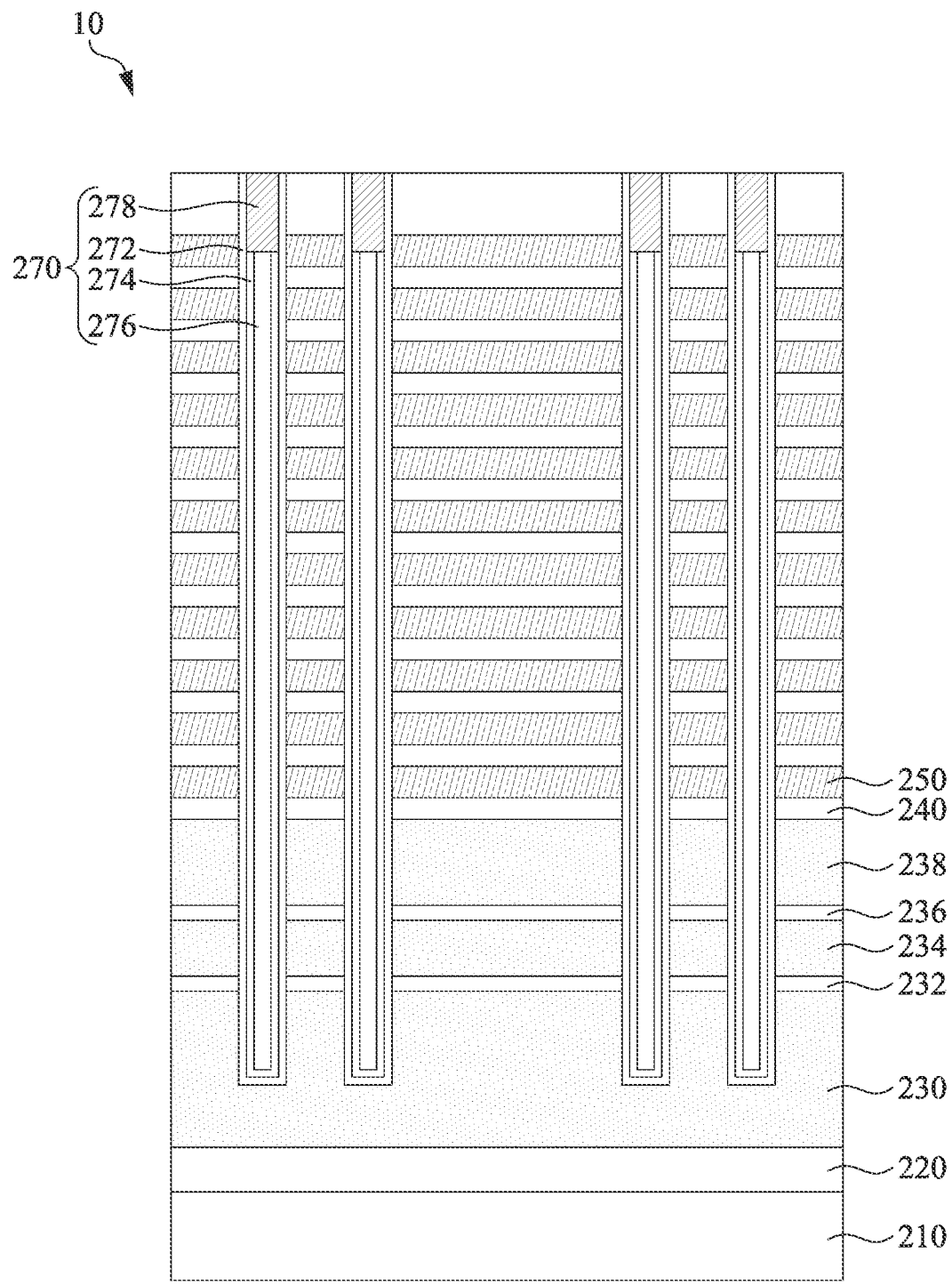

Referring to FIG. 7, in step S12, a plurality of memory cells 270 are formed in the holes 260 of FIG. 6, in which the memory cells 270 are vertically arranged on the substrate 210. The memory cells 270 are arranged parallel to the normal direction of the substrate 210. In some embodiments, each of the memory cells 270 includes a storage layer 272, a channel layer 274, and a dielectric pillar 276. The channel layer 274 is sandwiched between the storage layer 272 and the isolation pillar 276. The storage layer 272 and the channel layer 274 have U-shaped cross-sections. In some embodiments, the storage layer 272 is a multi-layer structure, such as an oxide-nitride-oxide (ONO) layer that is able to trap electrons. The channel layer 274 may be made of a material including poly silicon, and the dielectric pillar 276 may be made of dielectric material. Each of the memory cells 270 further includes a conductive plug 278 disposed on the dielectric 276 and in contact with the storage layer 272 and the channel layer 274.

Figure 8:
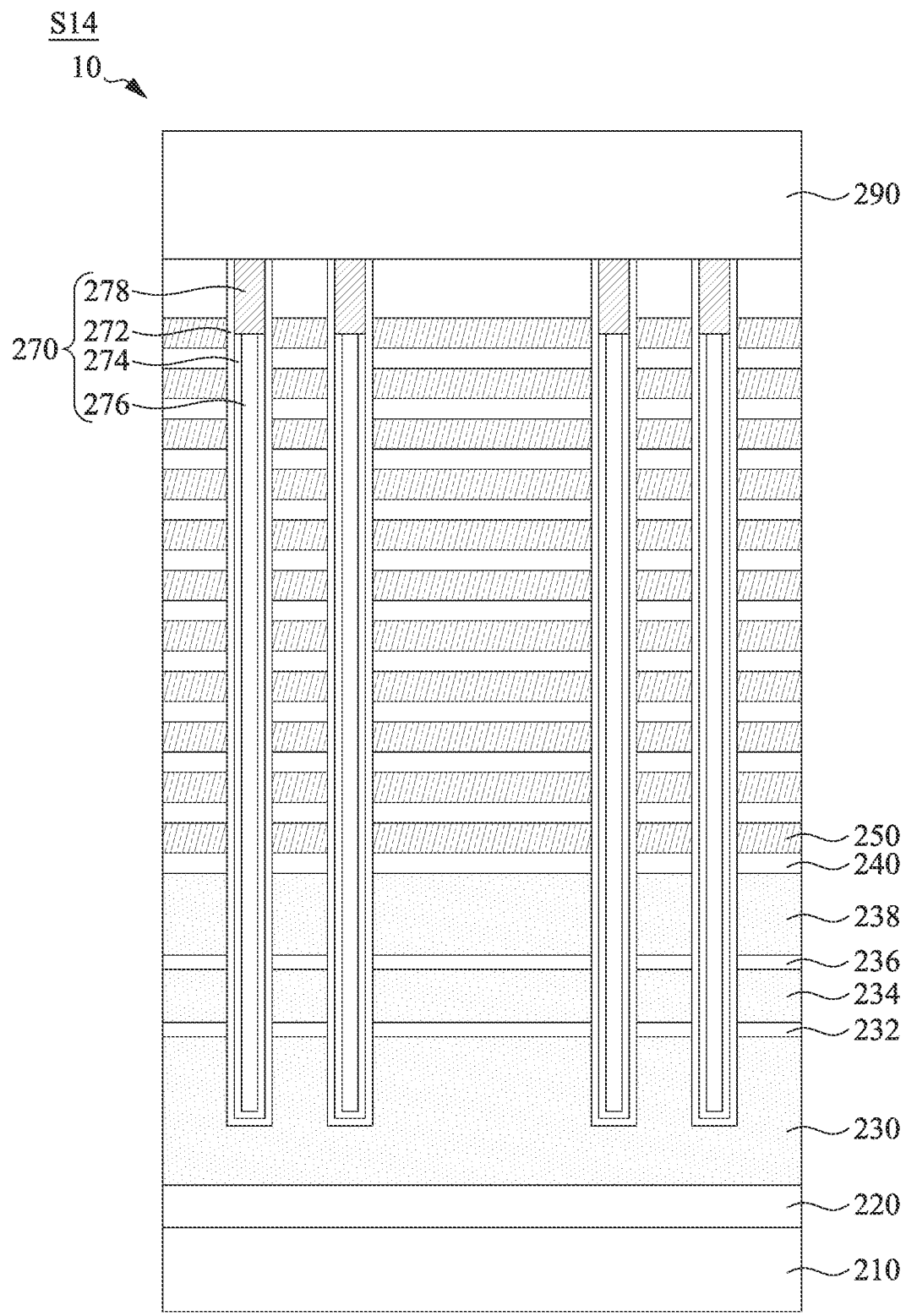
Figure 9:
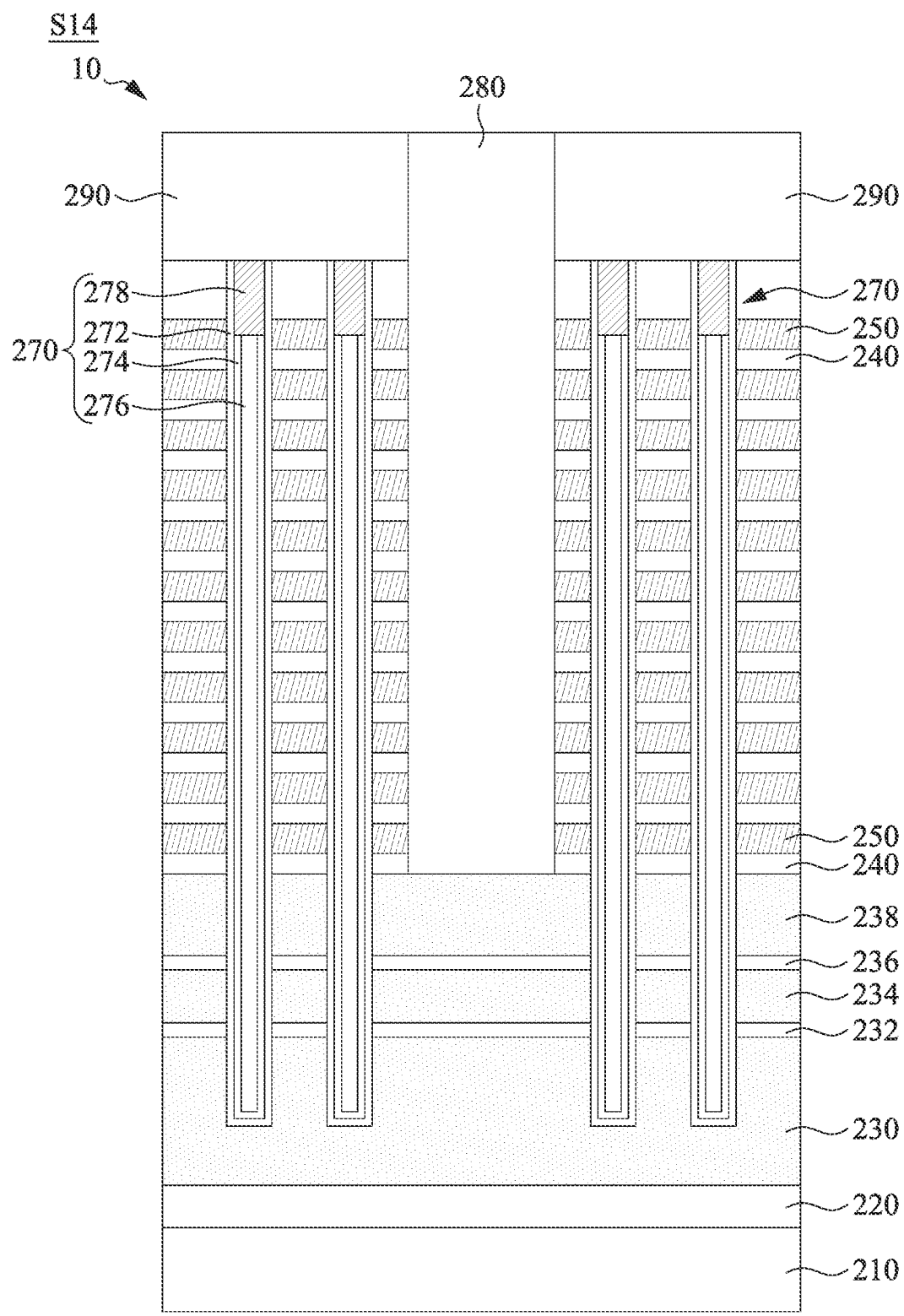
Figure 10:
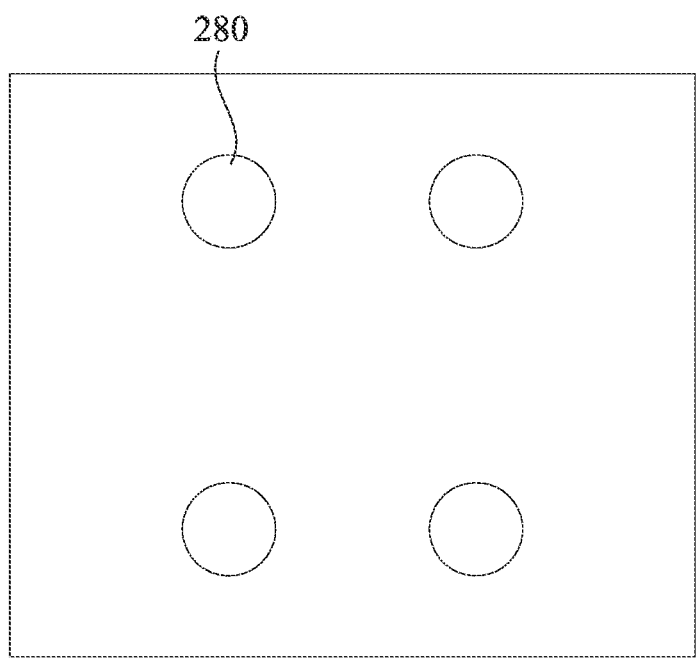

Referring to FIG. 8, FIG. 9, and FIG. 10, in step S14, a plurality of isolation pillars 280 are formed in the structure 10 of FIG. 7. More particularly, a mask 290 is formed on the structure 10 of FIG. 7, then an etching process is performed to form a plurality of openings to expose the third poly silicon layer 238. Step S14 further includes performing a deposition process to fill the openings thereby forming the isolation pillars 280. The material of the isolation pillars 280 is different from the material of the sacrificial layers 250. In some embodiments, the material of the isolation pillars 280 can be silicon oxide or carbon-doped silicon. The shape of the isolation pillars 280 can be a circle or any other suitable shape. In some embodiments, a diameter of each of the isolation pillars 280 is about 1 to 5 times of a diameter of each of the memory cells 270.

Figure 11:
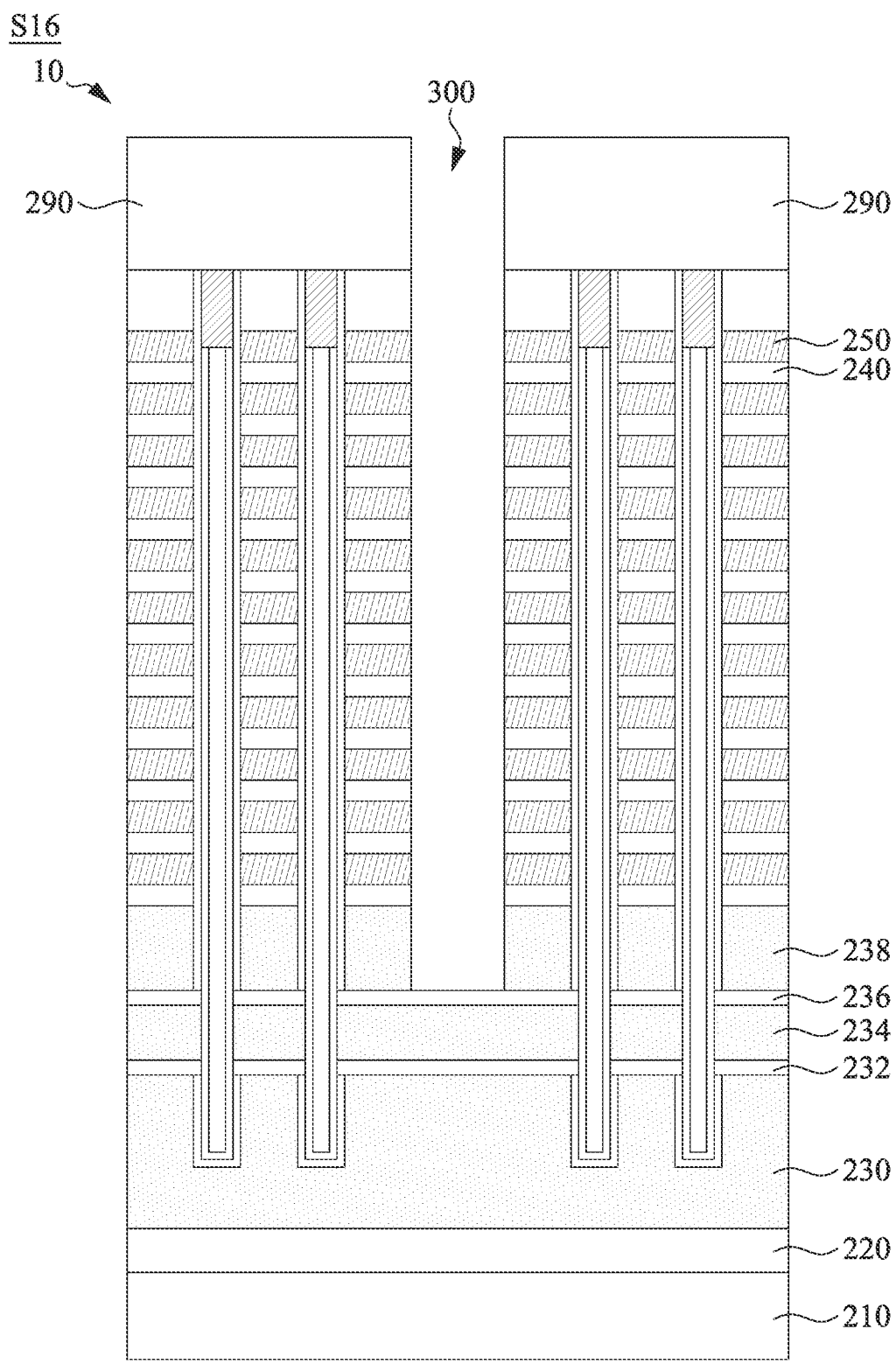
Figure 12:
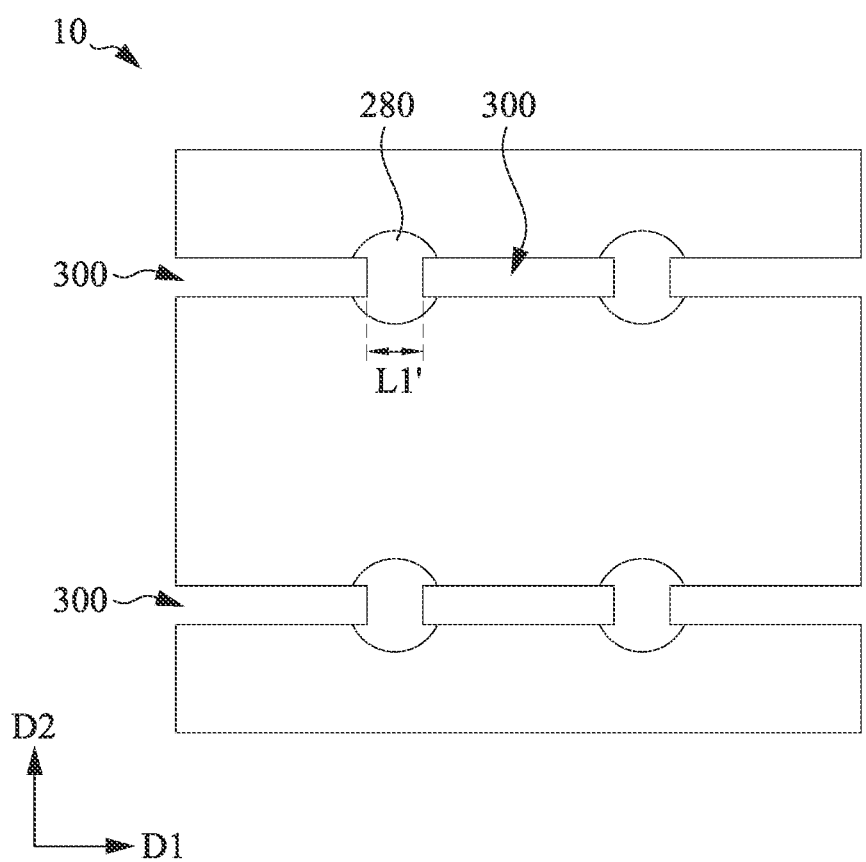

Referring to FIG. 11 and FIG. 12, in step S16, a plurality of slits 300 are formed in the structure 10 of FIG. 8. The slits 300 are formed extending along the first direction D1 and stop on the second oxide layer 236. Because the number of the insulating layers 240 and the sacrificial layers 250 in the stack is getting greater and greater, thus the etching depth is getting deeper and deeper. The slits 300 are formed cut into the isolation pillars 280 to ensure that the bottom of the insulating layers 240 and the sacrificial layers 250 can also be completely removed after the slits 300 are formed. That is, the sidewalls of the isolation pillars 280 are exposed from the slits 300, and there is no insulating layer 240 and/or sacrificial layer 250 remained on the sidewalls of the isolation pillars 280, viewed from the slits 300. The length L1' of the portions of the isolation pillars 280 directly between the slits 300 is reduced.

Figure 13:
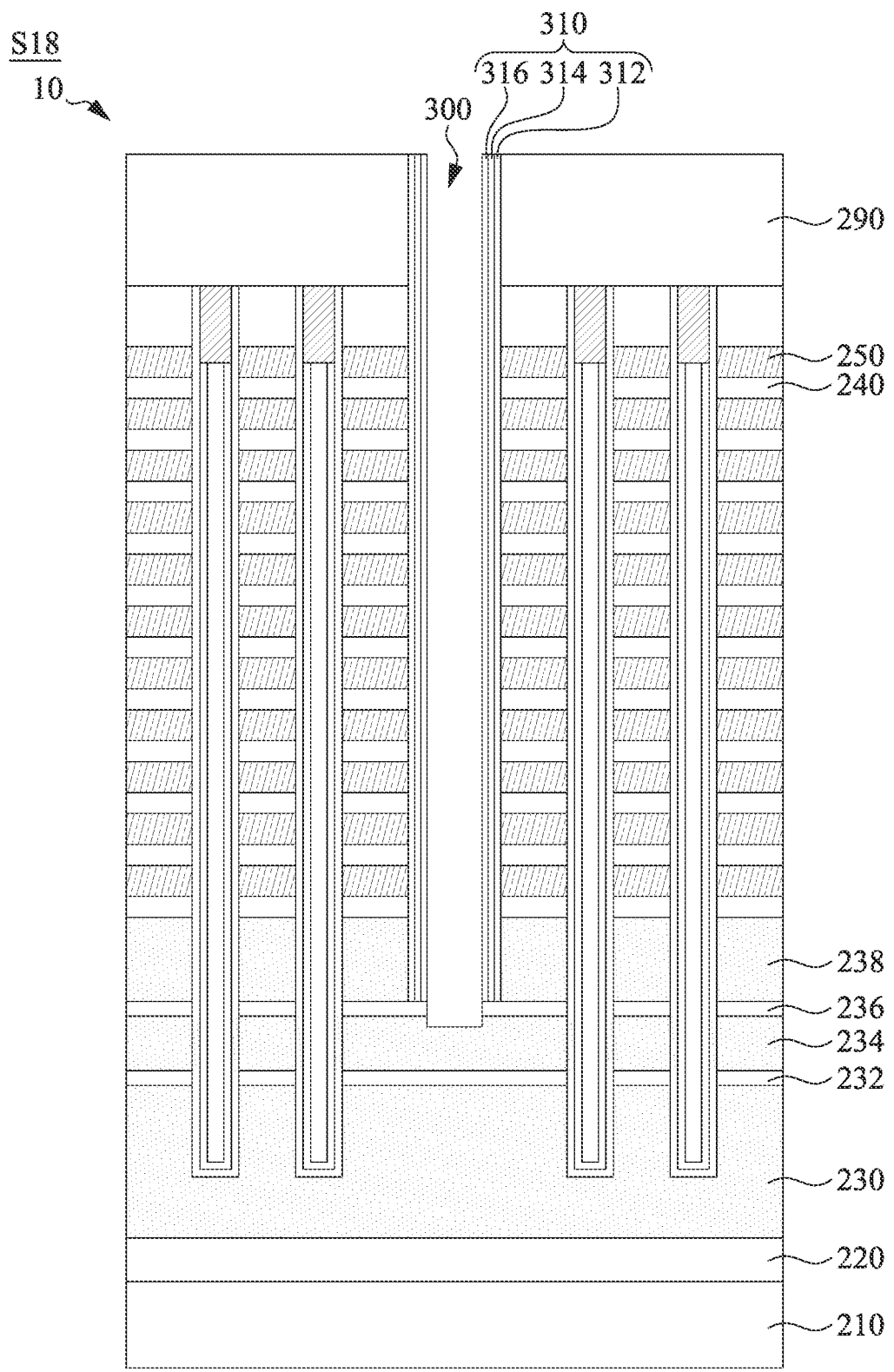

Referring to FIG. 13, in step S18, a spacer 310 is formed on the sidewalls of the slits 300. In some embodiments, the spacer 310 is a mufti-layer structure, which includes a first nitride layer 312, an oxide layer 314, and a second nitride layer 316, in which the first nitride layer 312 is formed on the sidewalls of the slits 300, and the oxide layer 314 is sandwiched between the first nitride layer 312 and the second nitride layer 316. The top surface of stack of the insulating layers 240 and the sacrificial layer 250 is protected by the mask 290.

Step S18 further includes, after the spacer 310 is formed, performing an etching process to deepen the slits 300. The etching process is performed to remove portions of the second oxide layer 236 and the second poly silicon layer 234 and stops at the second poly silicon layer 234 thus the sidewall of the second poly silicon layer 234 is exposed from the slits 300.

Figure 14:
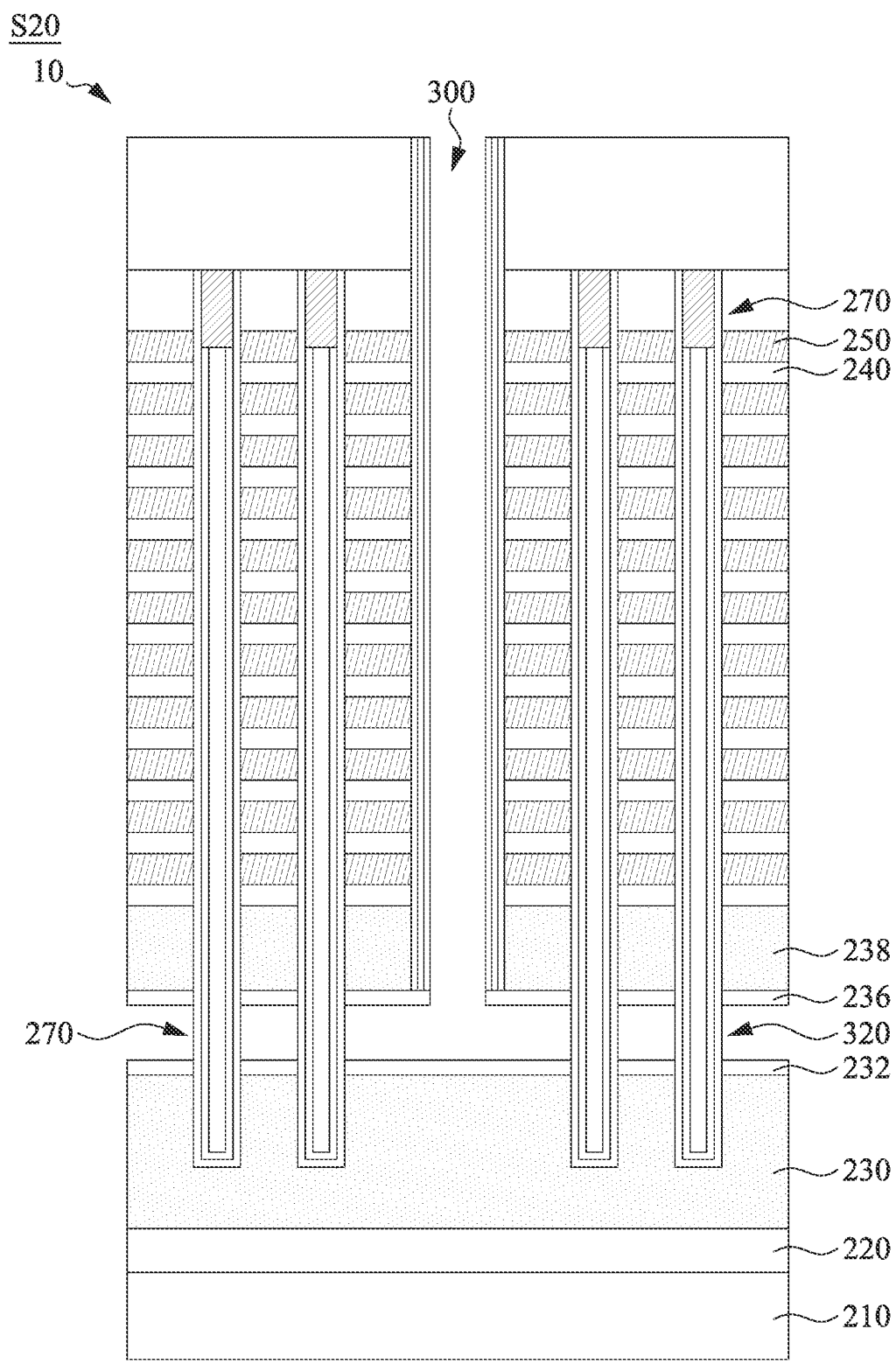

Referring to FIG. 14, in step S20, the second poly silicon layer 234 (see FIG. 13) is removed by using a wet etching. After the second poly silicon layer 234 is removed, a cavity 320 is formed between the first oxide layer 232 and the second oxide layer 236. Portions of the memory cells 270 between the first oxide layer 232 and the second oxide layer 236 are exposed from the cavity 320.

Figure 15:
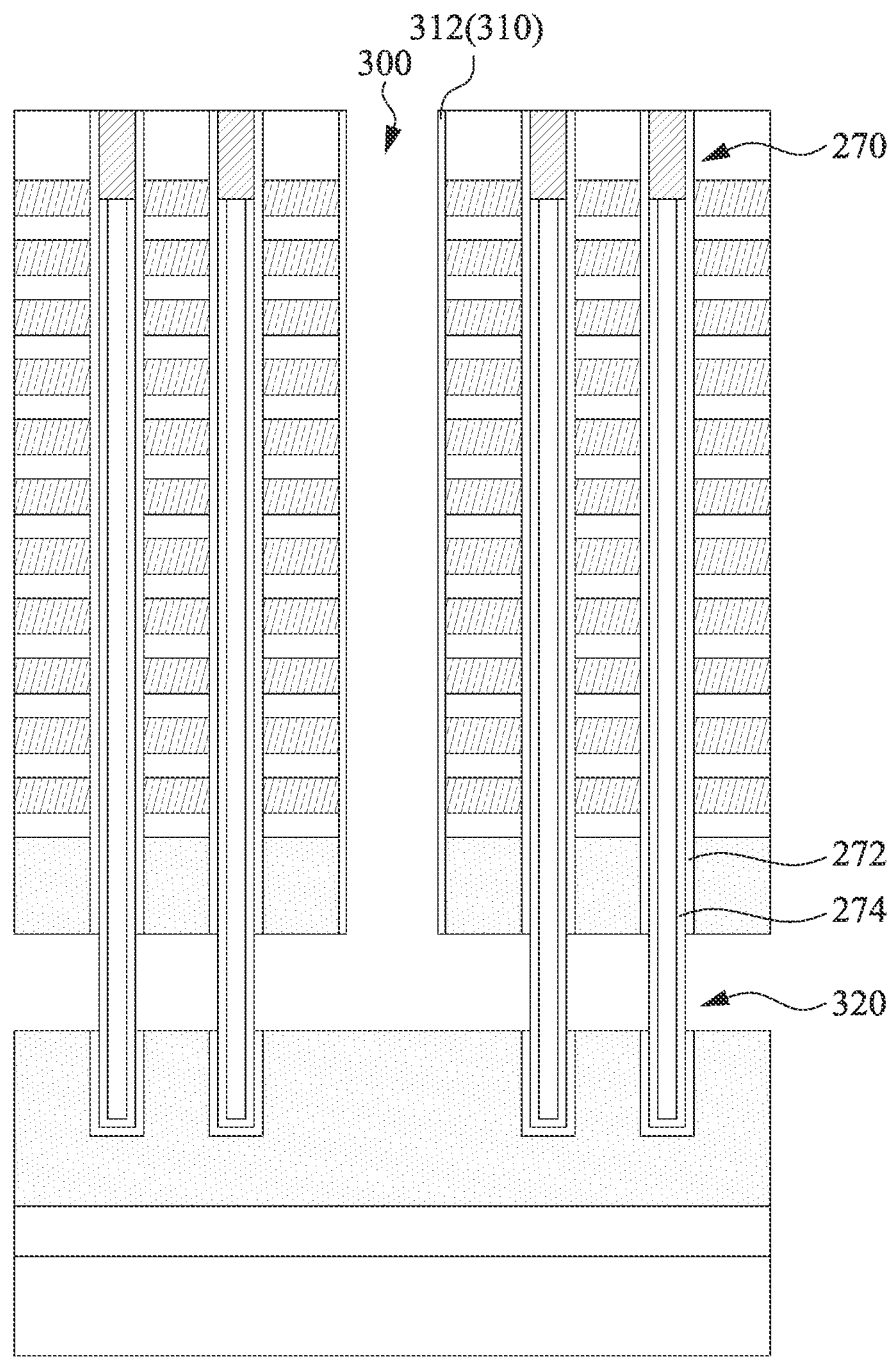

Referring to FIG. 15, in step S22, sequential etching processes are performed to remove portions of the storage layer 272 of the exposed portions of the memory cells 270. For example, a first etchant that etches oxide faster than nitride and a second etchant that etches nitride faster than oxide are utilized to remove the exposed portion of the storage layer 272, which is the oxide-nitride-oxide layer. During the processes of removing the exposed portions of the storage layer 272 (e.g. the oxide-nitride-oxide layer), the oxide layer 314 and the second nitride layer 316 of the spacer 310 (see FIG. 14), and the first oxide layer 232 and the second oxide layer 236 (see FIG. 14) are also removed accordingly. Therefore, the space of the cavity 320 is enlarged after the removing process. The first nitride layer 312 of the spacer 310 is remained on the sidewall of the slits 300.

Figure 16:
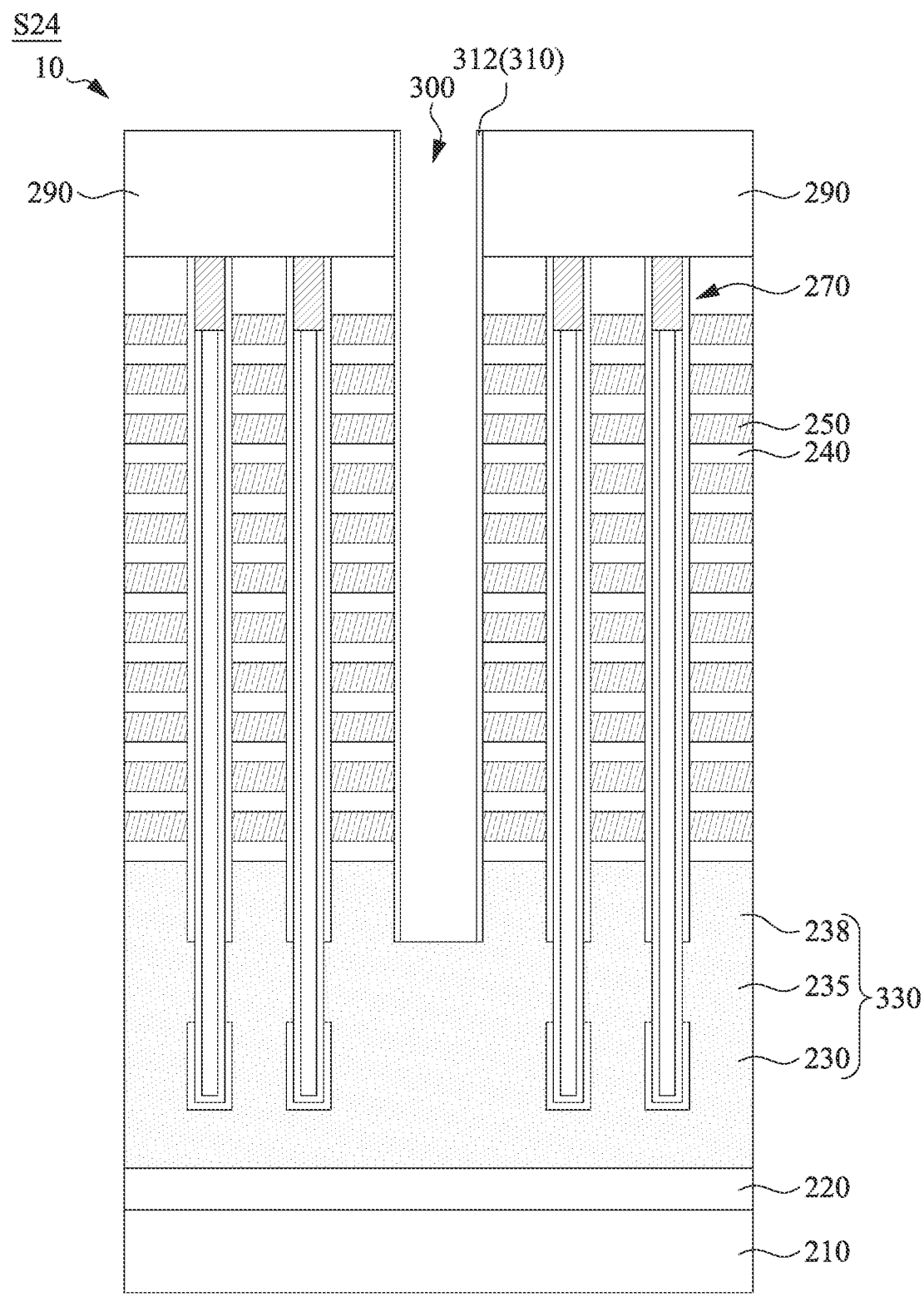

Referring to FIG. 16, in step S24, additional poly silicon material 235 is epitaxially grown and refilled in the cavity 320 (see FIG. 15). The poly silicon material 235 can be silicon doped with N-type dopants such as, for example, phosphorus (P) and arsenic (As) or doped with P-type dopants such as, for example, boron (B) and gallium (Ga). The combination of the remained third poly silicon layer 238, the poly silicon material 235, and the first poly silicon layer 230 serves as a common source plane 330.

Figure 17:
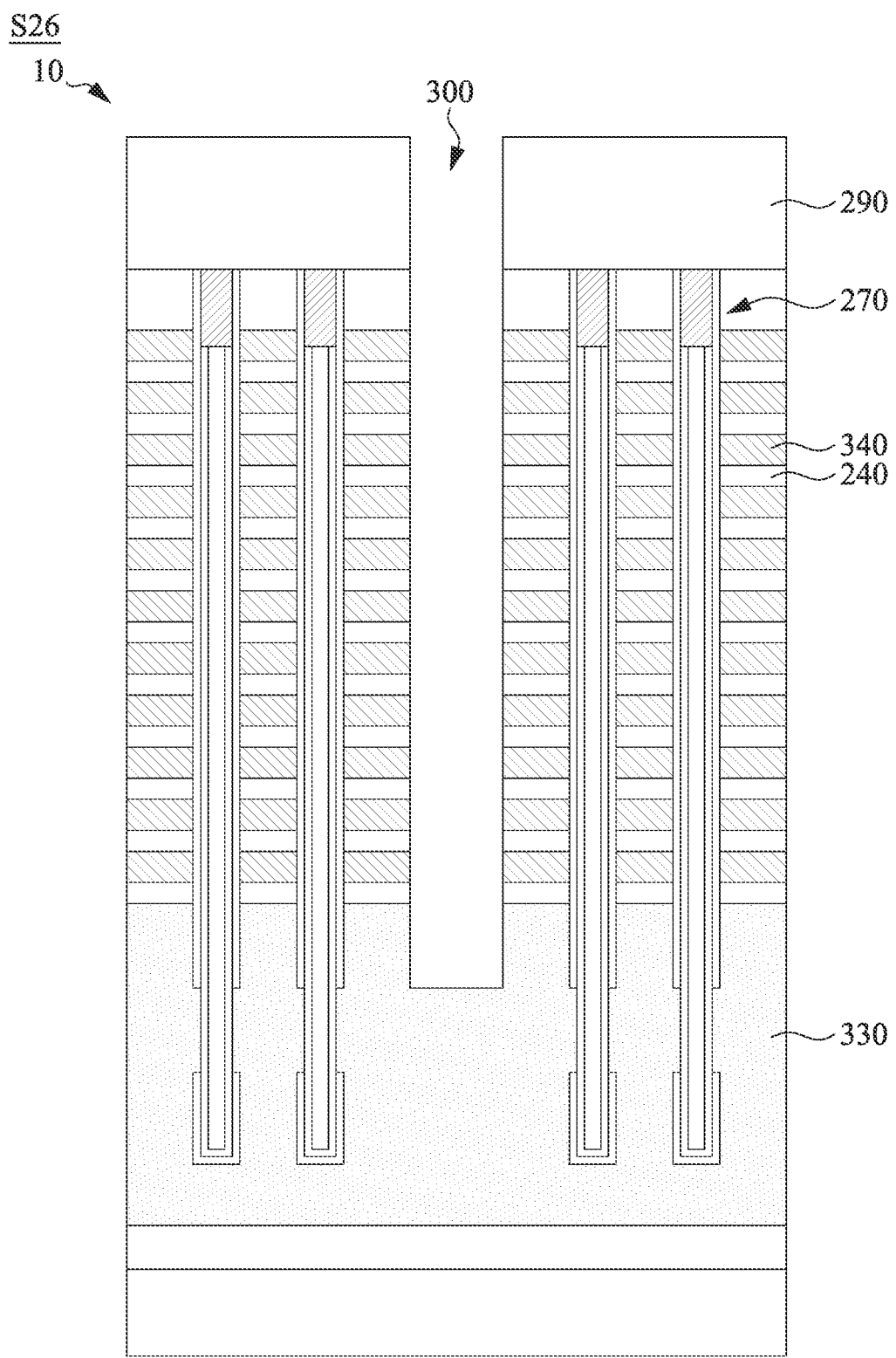
Figure 18:
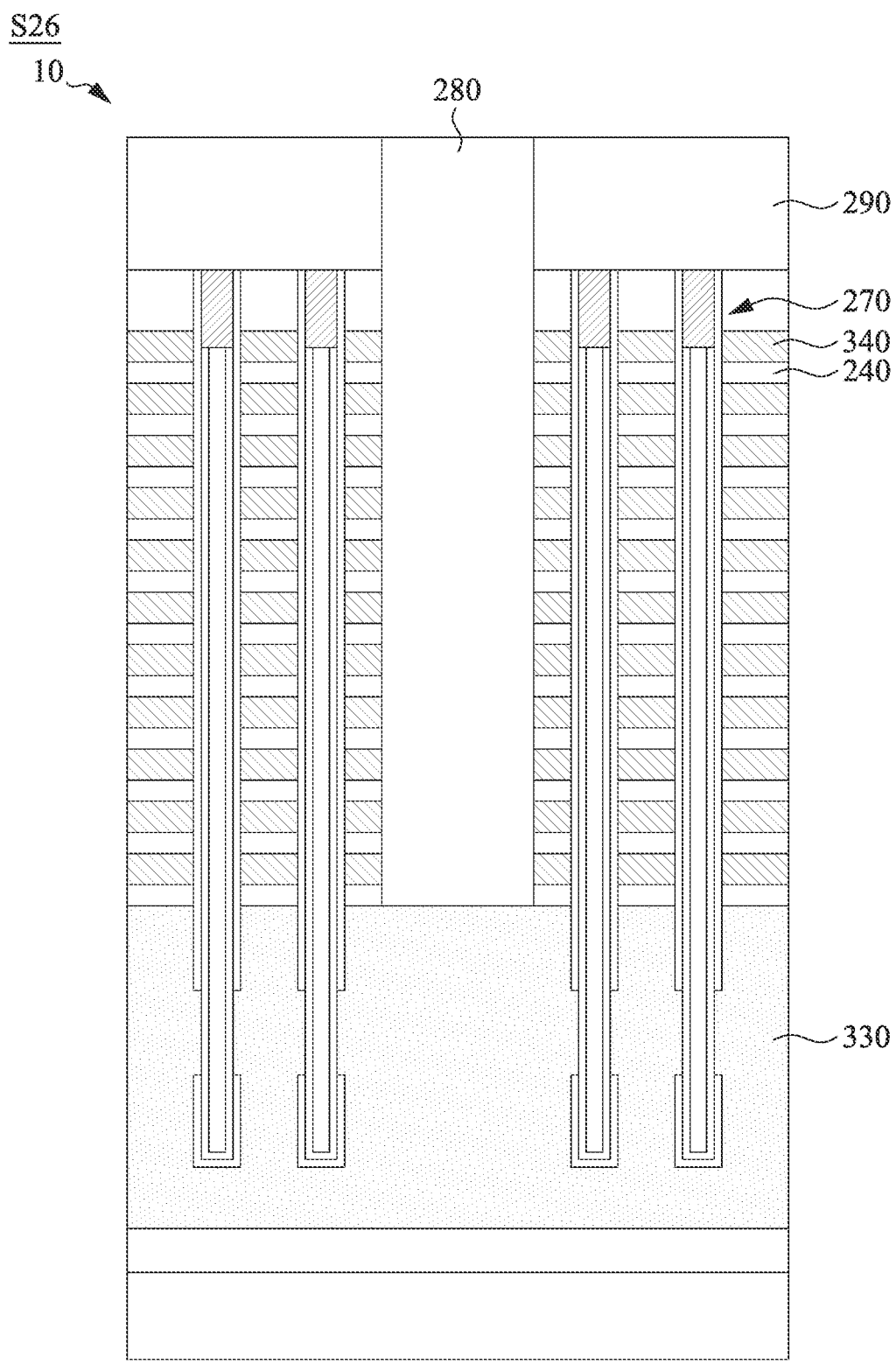

Referring to FIG. 17 and FIG. 18, in step S26, the sacrificial layers 250 (see FIG. 16) are replaced by a plurality of gate structures 340, and the gate structures 340 are formed surrounding the memory cells 270. An etching process is performed to remove the first nitride layer 312 (see FIG. 16) and the sacrificial layers 250. More particularly, the sacrificial layers 250 are silicon nitride layers, and the etching process is performed using an etchant that has a greater nitride etching rate than an oxide etching rate such that the insulating layers 240, which are silicon oxide layers, are remained after the sacrificial layers 250 and the first nitride layer 312 are removed. Portions of the memory cells 270 are exposed between the insulating layers 240 after the sacrificial layers 250 and the first nitride layer 312 are removed.

Then sequential of deposition processes are performed to form the gate structures 340 between the insulating layers 240 and adjacent the memory cells 270. Each of the gate structures 340 includes one or more gate dielectric layers and filling metal such as tungsten (W). After the gate structures 340 are formed, an etch back process is performed to recess the gate structures 340 and to expose the sidewalls of the filling metal of the gate structures 340.

Figure 19:
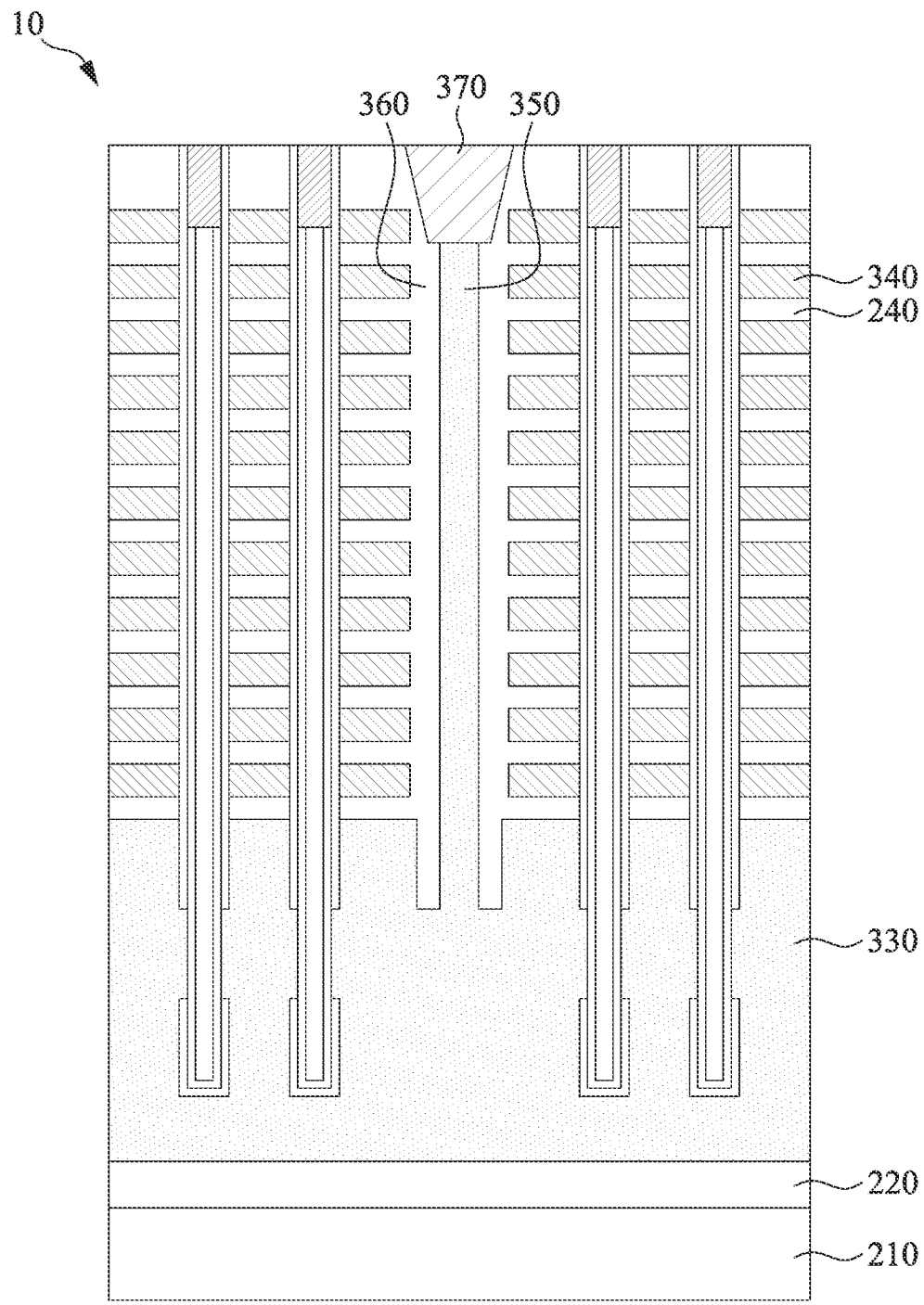
Figure 20:
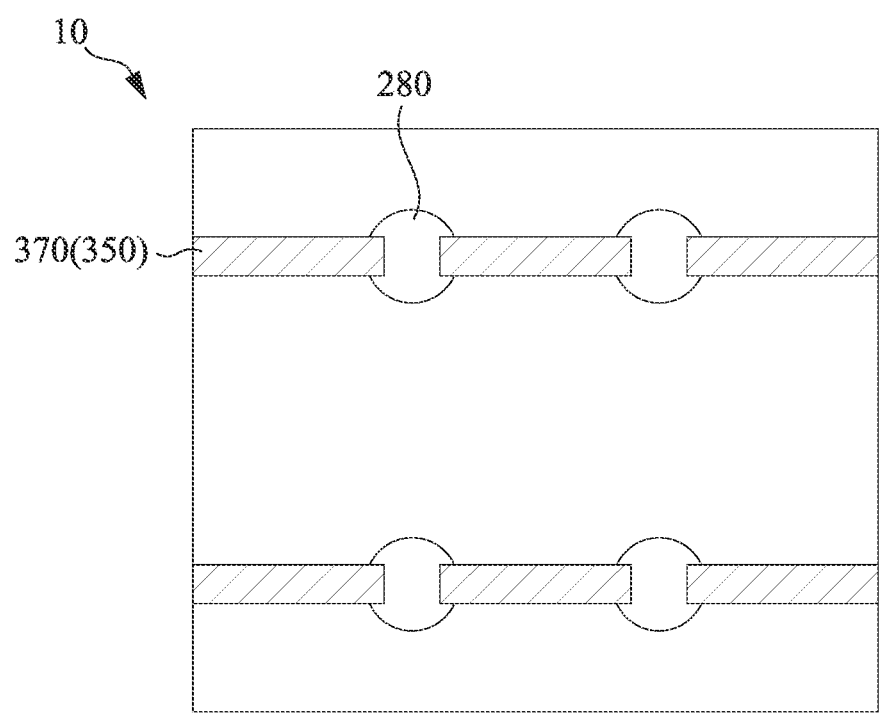

Referring to FIG. 19 and FIG. 20, in step S28, a plurality of common source lines 350 are formed filling the slits 300 (see FIG. 17). The step S28 includes depositing an oxide on the exposed sidewalls of the gate structures 340 and the insulating layers 240. Then an etching process is performed to remove a portion of the oxide such that the common source plane 330 is exposed. The remained oxide on the sidewalls of the gate structures 340 and the insulating layers 240 serves as isolation spacers 360.

Then a deposition process is performed to form the common source lines 350 to fill the slits 300 again. The common source lines 350 are surrounded by the isolation spacer 360. The common source lines 350 can be poly silicon doped with N-type or P-type dopants. Then a plurality of metal plugs 370 are formed connected to the common source lines 350.

The present disclosure interposes the isolation pillars into the common source lines to reduce the length of each segment of the common source lines.

Thus the wiggling or bending issue of the common source lines, induced by etching, thermal annealing, or other processes, can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure comprising:
    a substrate;
    a common source plane disposed on the substrate;
    a plurality of memory cells vertically disposed on the substrate and electrically connected to the common source plane;
    a common source line disposed on the substrate and electrically connected to the common source plane, wherein the common source line extends along a first direction and comprises a first segment and a second segment; and
    an isolation pillar interposing the first segment and the second segment of the common source line.

2. The semiconductor structure of claim 1, wherein ends of the first segment and the second segment of the common source line are embedded in the isolation pillar.

3. The semiconductor structure of claim 1, wherein the isolation pillar comprises:
    a first portion directly between the first segment and the second segment of the common source line; and
    a pair of second portions sandwiching the first portion and ends of the first segment and the segment of the common source line.

4. The semiconductor structure of claim 1, wherein the isolation pillar comprises:
    a first portion directly between the first segment and the second segment of the common source line; and
    a pair of second portions sandwiching the first portion, wherein a length of the first portion in the first direction is smaller than a length of the second portions in the first direction.

5. The semiconductor structure of claim 1, wherein the isolation pillar comprises:
    a first portion directly between the first segment and the second segment of the common source line; and
    a pair of second portions sandwiching the first portion, wherein a length of the second portions in the first direction is 1 to 5 times of a length of each of the memory cells in the first direction.

6. The semiconductor structure of claim 1, wherein a width of the isolation pillar in a second direction is greater than a width of the common source line in the second direction, in which the second direction is perpendicular to the first direction.

7. The semiconductor structure of claim 1, wherein a bottom of the isolation pillar has a bottom length, a top of the isolation pillar has a top length, and the bottom length is greater than the top length, in the first direction.

8. The semiconductor structure of claim 1, further comprising an isolation spacer between the common source line and the isolation pillar.

9. The semiconductor structure of claim 8, wherein a bottom of the isolation spacer is below a bottom of the isolation pillar.

10. The semiconductor structure of claim 1, wherein a material of the isolation pillar comprises silicon oxide or carbon-doped silicon.

11. The semiconductor structure of claim 1, further comprising a metal plug disposed on the common source line, wherein a top surface of the metal plug is level with a top surface of the isolation pillar.

12. The semiconductor structure of claim 1, further comprising a buffer layer disposed between the common source plane and the substrate.

13. A method of fabricating a semiconductor structure, comprising:
    forming a common source plane on a substrate;
    forming a plurality of insulating layers and a plurality of sacrificial layers alternately stacked on the common source plane;
    forming a plurality of memory cells penetrating the insulating layers and the sacrificial layers and electrically connecting to the common source plane;
    forming an isolation pillar penetrating the insulating layers and the sacrificial layers;

forming a slit penetrating the insulating layers and the sacrificial layers, wherein the slit is formed cut into the isolation pillar; and filling the slit with a common source line.

14. The method of claim 13, wherein a portion of the isolation pillar is removed during forming the slit.

15. The method of claim 13, wherein the slit is formed deeper than the isolation pillar.

16. The method of claim 13, further comprising:
before filling the slit with the common source line, forming an isolation spacer on a sidewall of the slit.

17. The method of claim 13, further comprising forming a metal plug on the common source line.

18. The method of claim 13, further comprising replacing the sacrificial layers with a plurality of gate structures.

19. The method of claim 13, wherein a material of the sacrificial layers is different from a material of the isolation pillar.

20. The method of claim 13, wherein a diameter of the isolation pillar is 1 to 5 times of a diameter of each of the memory cells.

* * * * *